United States Patent
Kang et al.

(10) Patent No.: US 6,754,096 B2
(45) Date of Patent: Jun. 22, 2004

(54) APPARATUS AND METHOD FOR DRIVING FERROELECTRIC MEMORY

(75) Inventors: Hee Bok Kang, Chungcheongbuk-do (KR); Hun Woo Kye, Kyonggi-do (KR); Geun Il Lee, Kyonggi-do (KR); Je Hoon Park, Kyonggi-do (KR); Jung Hwan Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/320,611

(22) Filed: Dec. 17, 2002

(65) Prior Publication Data

US 2003/0142531 A1 Jul. 31, 2003

(30) Foreign Application Priority Data

Jan. 29, 2002 (KR) ................................. 10-2002-0005150

(51) Int. Cl.[7] ............................................. G11C 11/22
(52) U.S. Cl. ................. 365/145; 365/230.08; 365/233.5
(58) Field of Search .............................. 365/145, 233.5, 365/230.08, 230.06, 189.05, 191, 189.08

(56) References Cited

U.S. PATENT DOCUMENTS

| 5,493,538 A | 2/1996 | Bergman ................. 365/233.5 |
| 5,566,129 A | 10/1996 | Nakashima et al. ...... 365/233.5 |
| 5,757,718 A | 5/1998 | Suzuki ..................... 365/233.5 |
| 6,091,623 A | * 7/2000 | Kang ......................... 365/145 |
| 6,525,989 B2 | * 2/2003 | Mizugaki et al. ........ 365/233.5 |
| 6,590,829 B2 | * 7/2003 | Takeuchi .................. 365/233.5 |

FOREIGN PATENT DOCUMENTS

JP          7-122093 A          5/1995

* cited by examiner

Primary Examiner—Michael S. Lebentritt
Assistant Examiner—Hien Nguyen
(74) Attorney, Agent, or Firm—Birch, Stewart, Kolasch & Birch, LLP

(57) ABSTRACT

Disclosed is an apparatus and method for driving a ferroelectric memory that can secure an enough read/write cycle time of a corresponding address during a chip is driven. In a driving circuit to generate an operation pulse for controlling operation of a ferroelectric chip, the ferroelectric memory driving apparatus includes an address latch block for latching a buffered address signal by a feedback cell operation pulse, an address transition detection summation value outputting block for generating an address transition detection pulse by detecting change of an address signal, and for outputting summation of address transition pulses generated by a plurality of addresses, a pulse width extension/control pulse generating block for extending a pulse width of the summation of the address transition pulses and outputting a chip control pulse by using an extended signal, and a cell operation pulse generating block for generating a cell operating pulse with a pulse width required on a read/write chip operation by using the chip control pulse, wherein in an active region of the cell operation pulse corresponding the address, an ATD signal of a different address is not generated.

19 Claims, 15 Drawing Sheets cell operation pulse(OP)

cell operation pulse(OP)

US 6,754,096 B2

APPARATUS AND METHOD FOR DRIVING FERROELECTRIC MEMORY

This application claims the benefit of the Korean Application No. P 2002-5150 filed on Jan. 29, 2002, which is hereby incorporated by reference.

BACKGROUND OF THE INVENTION

1. Field of the Invention

The present invention relates to a ferroelectric memory, and more particularly, to an apparatus and method for driving a ferroelectric memory that can secure enough read/write cycle time of a corresponding address when a chip is driven.

2. Discussion of the Related Art

Generally, a nonvolatile ferroelectric memory, i.e., a ferroelectric random access memory (FRAM), becomes the center of attention as the next-generation memory device since it has a data processing speed of the dynamic random access memory (DRAM) grade and preserves stored data even if the power is off.

The FRAM is a memory device having a similar structure to the DRAM, and uses a high residual dielectric polarization that is the characteristic of a ferroelectric material that is used as a material of a capacitor in the memory device.

Due to the characteristic of the residual dielectric polarization, the data stored in the memory device is not erased even if an applied electric field is removed.

FIG. 1 is a characteristic diagram illustrating the hysteresis loop of a general ferroelectric material.

As shown in FIG. 1, even though the electric field is removed, the polarization induced by the electric field does not vanish due to the existence of the residual dielectric polarization (or spontaneous polarization), but is kept a specified amount (i.e., states d and a).

In the nonvolatile ferroelectric memory cell, the states d and a can correspond to 1 and 0, respectively, and this characteristic enables the cell to be used as a memory device.

Hereinafter, the conventional nonvolatile ferroelectric memory device will be explained with reference to the accompanying drawings.

FIG. 2 is a view illustrating the construction of a unit cell of the conventional nonvolatile ferroelectric memory device.

As shown in FIG. 2, the unit cell of the conventional nonvolatile ferroelectric memory cell includes a bit line B/L formed in one direction, a word line W/L formed in a direction crossing the bit line B/L, a plate line P/L formed in the same direction as the word line W/L at a specified distance from the word line W/L, a transistor T1 whose gate is connected to the word line W/L and whose source is connected to the bit line B/L, and a ferroelectric capacitor FC1 whose first terminal is connected to a drain of the transistor T and whose second terminal is connected to the plate line P/L.

The data input/output operations of the non-volatile ferroelectric memory device are as follows.

FIG. 3A is a timing diagram illustrating an operation of a write mode of a common non-volatile ferroelectric memory device. FIG. 3B is a timing diagram illustrating an operation of a read mode.

In the case of the write mode, when a chip enable signal CSBpad applied from the outside is activated from high to low and a write enable signal WEBpad is applied from high to low, the write mode begins.

When address decoding begins in the write mode, a pulse applied to a corresponding word line is transited from low to high and a cell is selected.

In a period where the word line maintains a high state, a uniform period of high signal and a uniform period of low signal are sequentially applied to a corresponding plate line. In order to write a logic value "1" or "0" to a selected cell, a "high" or "low" signal synchronized with the write enable signal WEBpad is applied to a corresponding bit line.

That is, when a high signal is applied to the bit line and when a signal applied to the plate line is at a low state in a period where a signal applied to the word line is at a high state, a logic value "1" is recorded in a ferroelectric capacitor. When a low signal is applied to the bit line and a signal applied to the plate line is a high signal, a logic value "0" is recorded in the ferroelectric capacitor.

An operation of reading data stored in a cell is as follows.

When the chip enable signal CSBpad is activated from high to low from the outside, all of the bit lines are equipotentialized to a low voltage by an equalizing signal before a corresponding word line is selected.

After the respective bit lines are deactivated, the address is decoded and a low signal is transited to a high signal in a corresponding word line by a decoded address, to thus select a corresponding cell. Data Qs corresponding to the logic value "1" stored in the ferroelectric memory is destroyed by applying a high signal to the plate line of a selected cell.

If the logic value "0" is stored in the ferroelectric memory, data Qns corresponding to the logic value "0" is not damaged. Accordingly, destroyed data and the data that is not destroyed output different values by the above-mentioned principle of the hysteresis loop. Therefore, a sense amplifier senses the logic value "1" or "0".

That is, when data is destroyed, a state is changed from d to f like in the hysteresis loop of FIG. 1. When data is not destroyed, a state is changed from a to f. Therefore, when the sense amplifier is enabled after a uniform time passes, data is amplified, to thus output the logic value "1". When data is not destroyed, data is amplified and the logic value "0" is output.

After the data is amplified through the sense amplifier, the plate line is deactivated from high to low in a state where a high signal is applied to a corresponding word line because the data must be recovered to original data.

In the ferroelectric memory performing the read/write operation, when an address is changed and a new address is set, an enough time for completing a normal read/write operation by a corresponding address is required.

That is, when a corresponding address period is smaller than a cycle time, memory cell data may be damaged.

However, such a conventional ferroelectric memory has the following problem.

An enough time for completing a normal read/write operation by a corresponding address is required. However, in a conventional technology, when a different address comes, it is not possible to intercept the address. Accordingly, the cycle time of the corresponding address is not guaranteed.

When the cycle time of the corresponding address is not guaranteed, address short pulse noise is generated to affect a chip operation and to damage data.

SUMMARY OF THE INVENTION

Accordingly, the present invention is directed to an apparatus and method for driving a ferroelectric memory that substantially obviates one or more problems due to limitations and disadvantages of the related art.

An object of the present invention is to provide an apparatus and method for driving a ferroelectric memory that can secure an enough read/write cycle time of a corresponding address during when a chip is driven.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve the object and other advantages and in accordance with the purpose of the invention, as embodied and broadly described herein, the present invention provides an apparatus for driving a ferroelectric memory in a driving circuit that generates an operation pulse for controlling operation of a ferroelectric chip, the apparatus including an address latch block for latching a buffered address signal by a feedback cell operation pulse, an address transition detection summation ATDSUM value outputting block for generating an address transition detection pulse (ATD) signal by detecting change of an address signal, and for outputting summation of address transition pulses ATDSUM generated by a plurality of addresses, a pulse width extension/control pulse generating block for extending a pulse width of the summation of the address transition pulses ATDSUM and outputting a chip control pulse by using an extended signal, and a cell operation pulse generating block for generating a cell operating pulse with a pulse width required on a read/write chip operation by using the chip control pulse, wherein in an active region of the cell operation pulse corresponding to the address, an ATD SIGNAL of another address is not generated.

To achieve the object and other advantages and in accordance with the purpose of the invention, as embodied and broadly described herein, the present invention provides method for driving a ferroelectric memory in a case that one cycle time is divided into intervals of t0, t1, t2, t3, t4, and t5 in order to generate an operation pulse for controlling an operation of a ferroelectric chip, the method comprising the steps of a) generating an address transition detecting pulse (ATD) signal at a starting portion of the t1 period when an address transition is occurred at an end portion of the t0 period, b) summing the ATD and outputting the summed address transition detection pulse ATDSUM, and c) extending a pulse width of the summed address transition detection pulse ATDSUM so as for an end edge time thereof to extend to the t3 period and producing a control pulse CP by using the same. A cell operation pulse OP at from the t2 period to the t5 period according to the control pulse CP is produced so that a normal read/write operations is performed from the t2 period t5 period and generation of the address transition detection pulse (ATD) signal is intercepted though new address is entered into an active period of the cell operation pulse OP.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an apparatus and method for driving a ferroelectric memory according to the present invention will now be described in detail with reference to the attached drawings.

Because cell data is destroyed in a process of sensing data, a period of recovering the destroyed data is required.

When a unfit period including a period of recovering destroyed data is defined as "cycle time", according to the present invention, during the cycle time of a corresponding address, even though a different address come in, the address is intercepted. The different address does not affect to a chip operation. Accordingly, an enough chip operation time is secured.

Figure 1:
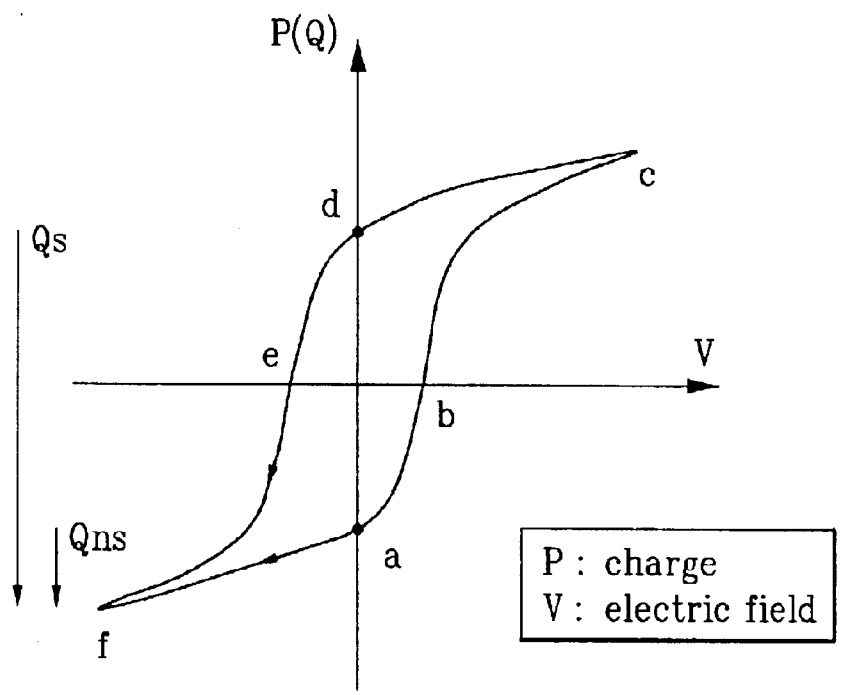
FIG. 1 is a view illustrating a hysteresis loop characteristic of a conventional ferroelectric memory.
Figure 2:
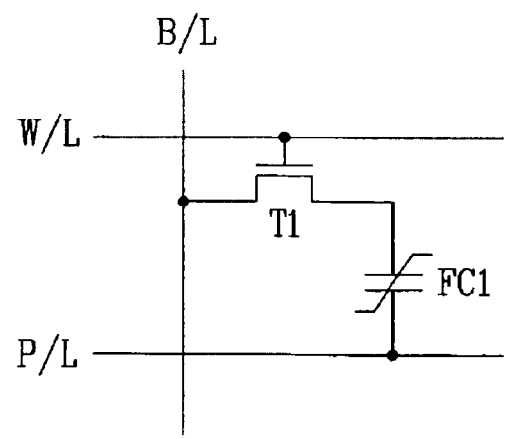
FIG. 2 is a block diagram illustrating a unit cell of a conventional ferroelectric memory.
Figure 3A:
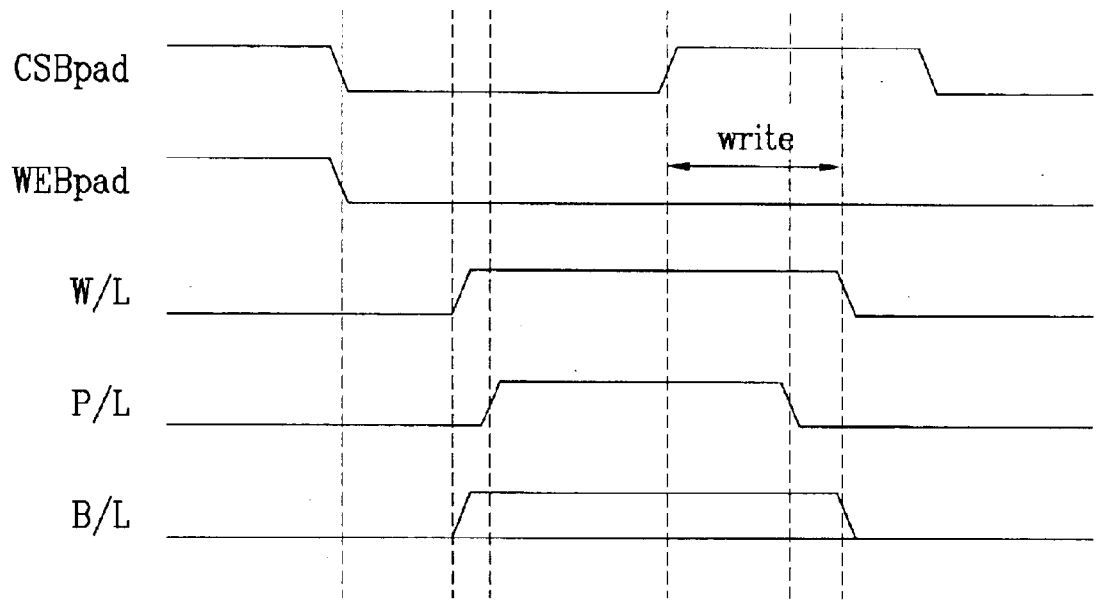
FIG. 3A is an operation timing diagram of a write mode of a ferroelectric memory.
Figure 3B:
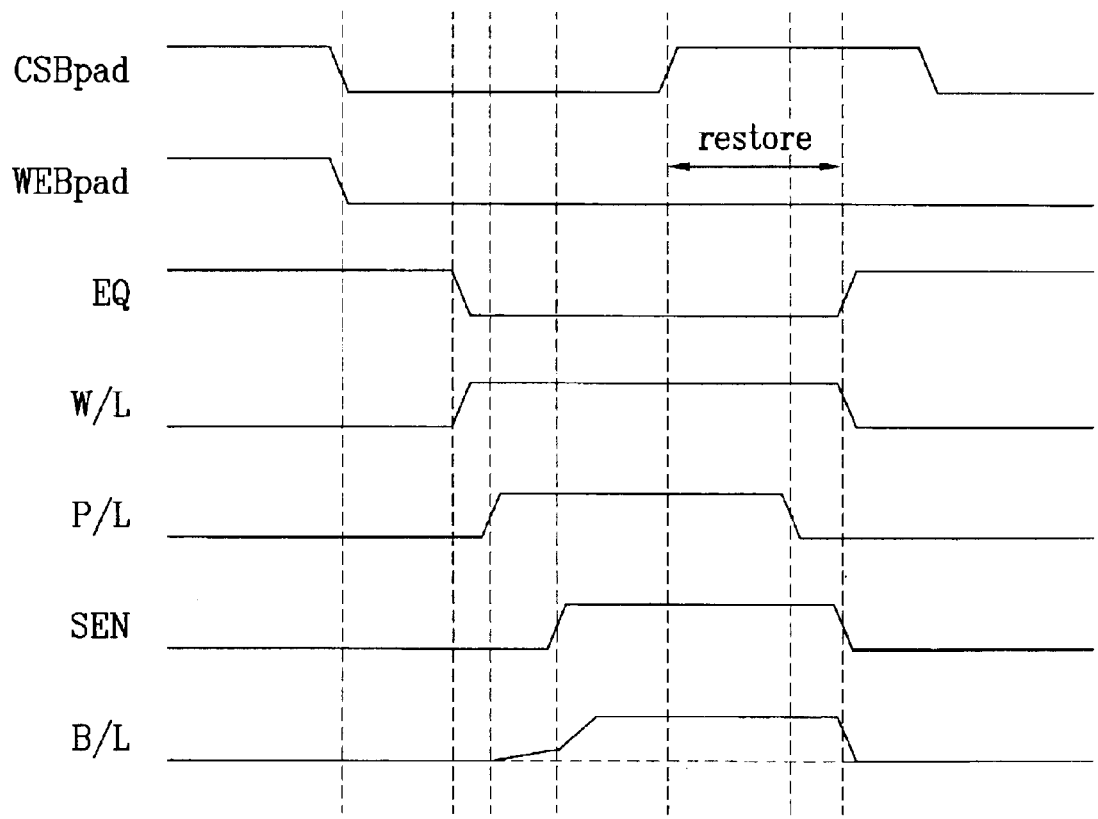
FIG. 3B is an operation timing diagram of a read mode of a ferroelectric memory.
Figure 4:
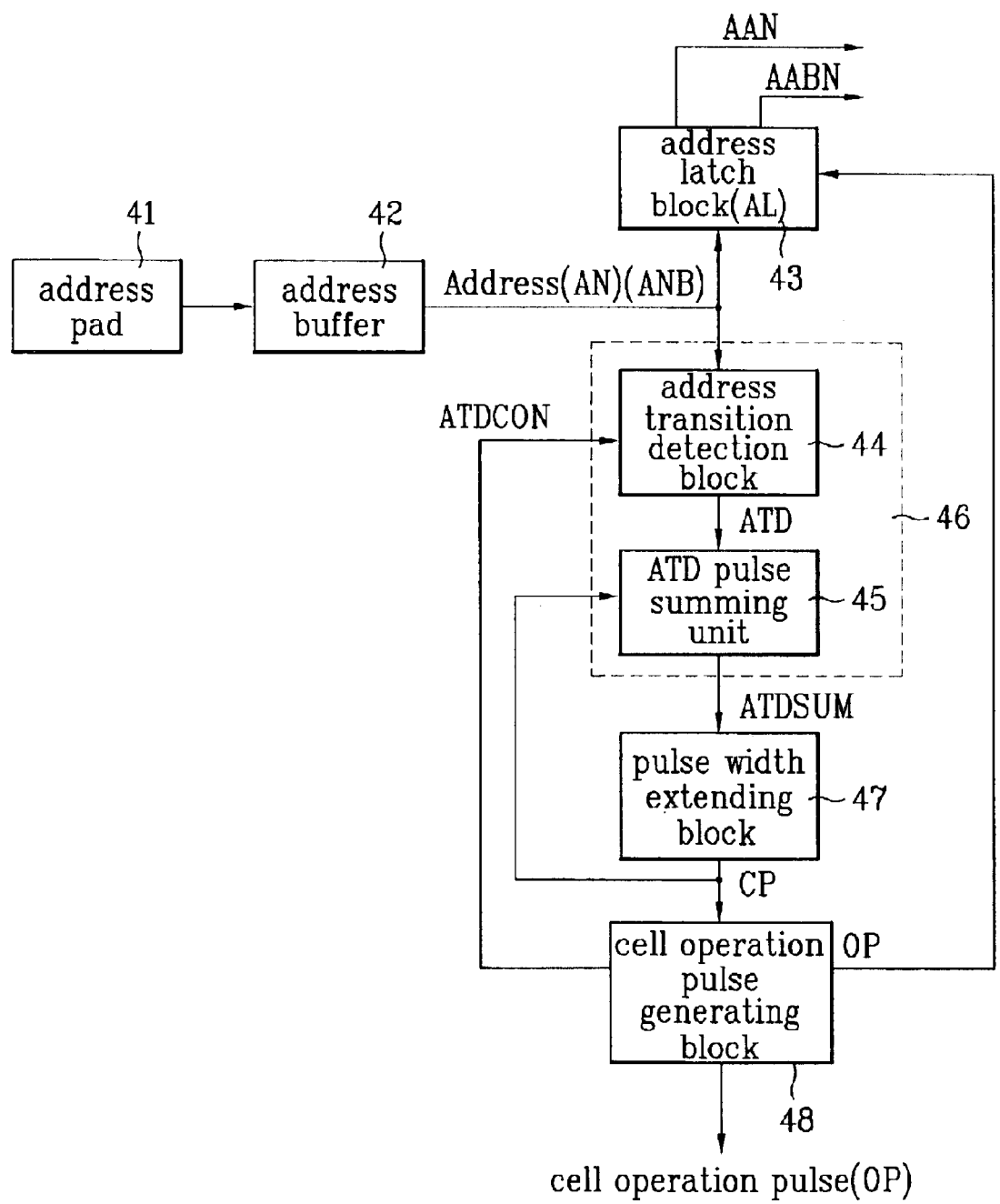
FIG. 4 is a block diagram illustrating a structure of an apparatus for driving a ferroelectric memory according to a first embodiment of the present invention.
Figure 5:
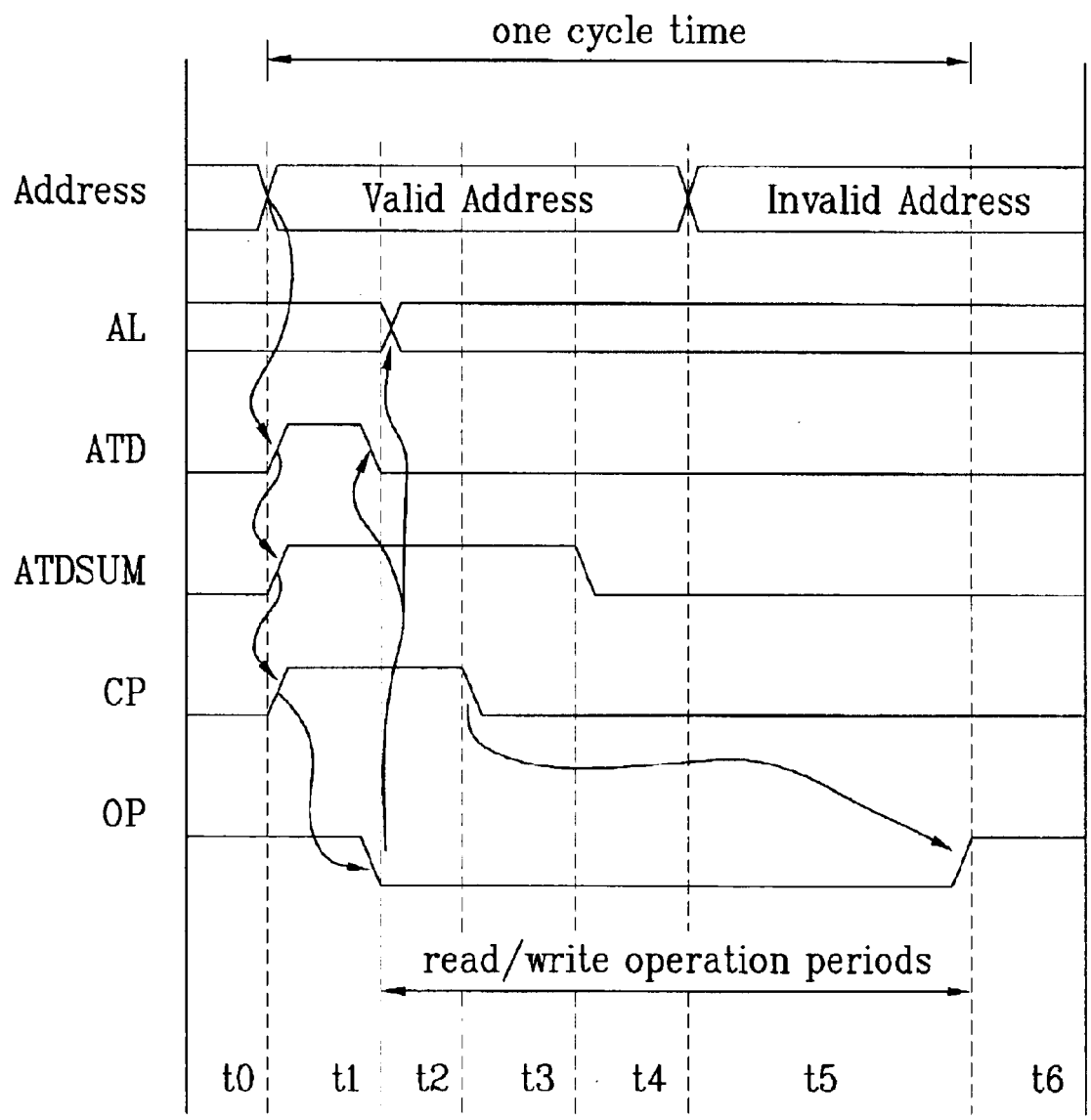
FIG. 5 is an operation timing diagram illustrating the apparatus for driving a ferroelectric memory of FIG. 4.

FIG. 4 is an operation timing diagram of an apparatus for driving a ferroelectric memory according to a first embodiment. FIG. 5 is an operation timing diagram of the apparatus for driving a ferroelectric memory of FIG. 4.

In the ferroelectric memory according to the present invention, each of blocks for generating a cell operation pulse includes an address pad 41, to which an address signal is applied, an address buffer 42 for buffering and outputting an address signal applied to the address pad 41, an address latch block AL 43 for latch outputting an address signal in order to remove address skew by inputting a buffered address signal address (AN) (ANB), an ATDSUM value output block 46 including an address transition detection block 44 for sensing a change in an address signal and generating an address transition detection pulse when the buffered address signal is input and an ATD summing unit 45 for summing the ATD generated by a plurality of addresses and outputting the resultant, and a pulse width extension/control pulse generating block 47 for extending the pulse width of the output signal ATDSUM of the ATDSUM value output block 46 and outputting a chip control pulse (CP) using an extended pulse signal in order to suppress data loss occurring because a normal cycle time is not guaranteed by an ATDSUM signal having an abnormally small pulse width.

The pulse width extension/control pulse generating block 47 receives the start edge of a pulse signal whose pulse width is extended, generates the CP, feeds back the CP to the ATD pulse summing unit 45 of the ATDSUM value output block 46, and lets a pulse signal whose pulse width is extended is stabilized in a CP period.

The CP of the pulse width extension/control pulse generating block 47 is input to a cell operation pulse (OP) generating block 48. The cell operation pulse generating block 48 generates the cell OP having a pulse width required for a normal read/write chip operation.

The cell OP of the cell operation pulse generating block 48 is fed back to the address transition detection block 44 and is used as a control signal ATDCON during address transition detection.

This is for intercepting the input of an ATD signal from the start edge of the cell OP to the edge of the end.

The cell OP is fed back to the address latch block 43, which is for latching the address signal at the start edge of the cell OP.

The reason of latching the address at the start edge of the cell OP is for securing a margin of an address input time difference to the address pad and for not affecting a chip operation even though address input skew occurs.

A signal (AAN)(AABN) output from the address latch block 43 is output to a pre-decoder (not shown).

An overall procedure of generating a cell operation pulse by an apparatus for driving a ferroelectric memory according to a first embodiment according to the present invention.

As illustrated in FIG. 5, when address transition occurs at the end of a t0 period, an ATD signal is generated at the starting point of a t1 period.

The pulse width of the ATD is extended so that the ATD is summing output (ATDSUM) by the ATD summing portion 45 and that the end edge time is extended to a t3 period by the pulse width extension/control pulse generation block 47. The CP is generated by the ATD signal.

A cell OP from t2 to t5 is generated through the CP. A normal read/write operation is performed during a period from t2 to t5.

An ATD output is deactivated and an address latch is generated through the cell OP.

Even though a new address comes in the cell OP period, t4 and t5 periods, the new address is not effective because the generation of the ATD is prevented.

The detailed structures and operations of the respective blocks related to the generation of the cell OP will be described as follows.

Figure 6:
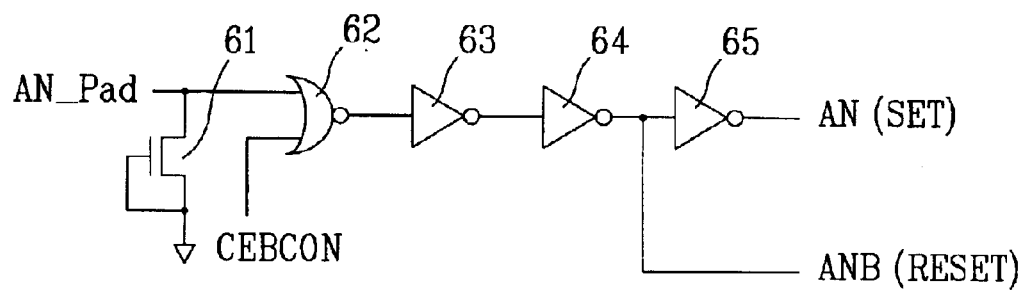
FIG. 6 is a detailed block diagram of an address buffer according to the present invention.

FIG. 6 is a detailed block diagram of an address buffer according to the present invention.

The address buffer includes a logic operation means 62, to whose first input port having an ESD transistor 61 an address pad signal AN-Pad is applied and to whose second input port a chip enable control signal CEBCON is applied, to thus performing a NOR operation on these signals, a first inverter 63 for inverting an output signal of the logic operation means 62, a second inverter 64 for inverting an output signal of the first inverter 63 and outputting an address signal ANB for performing reset, a third inverter 65 for inverting an output signal of the second inverter 64 and outputting an address signal AN.

Figure 7:
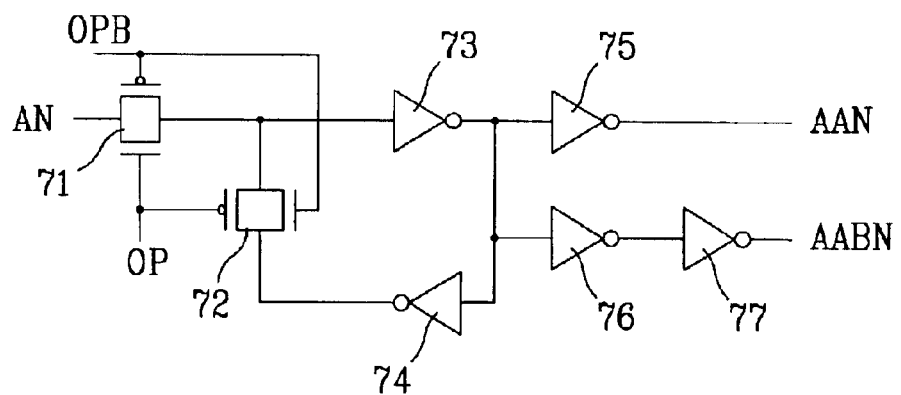
FIG. 7 is a detailed block diagram of an address latch according to the present invention.

As illustrated in FIG. 7, the address latch according to the present invention includes a first transmission gate 71 for selectively switching output the output signal AN of the address buffer 42 by the cell OP and a cell operation pulse OPB, a latch means including first and second inverters 73 and 74 serially connected to the output port of the first transmission gate 71, the latch means for latching an output signal of the first transmission gate 71, a second transmission gate 72 for selectively switching the output signal fed back by the latch means by the cell OP and the cell operation pulse OPB and outputting the output signal to the output port of the first transmission gate 71, a third inverter 75 for inverting the output signal of the first inverter 73 and outputting an inverted signal AAN to a pre-decoder, a fourth inverter 76 for inverting an output signal of the first inverter, and a fifth inverter 77 for inverting an output signal of the fourth inverter 76 and outputting an inverted signal AABN to a pre-decoder.

A detailed structure of an ATDSUM value output block is as follows.

Figure 8:
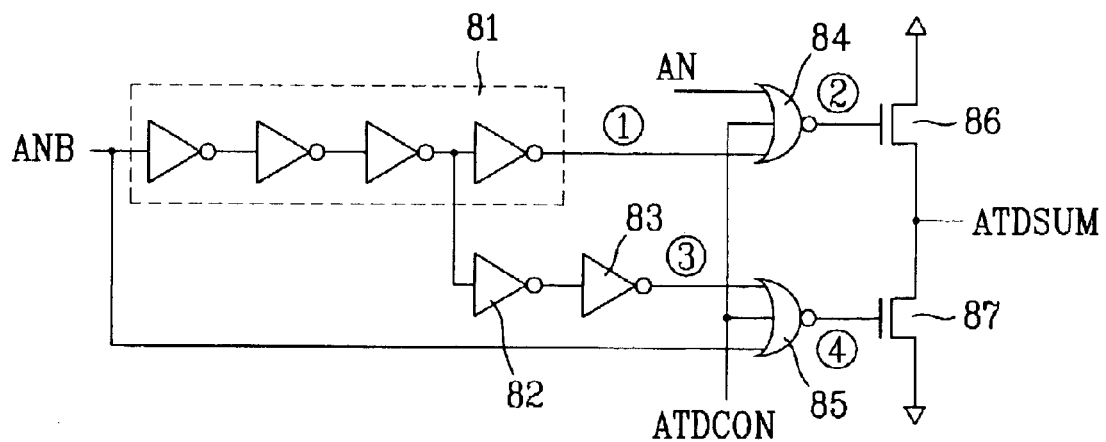
FIG. 8 is a block diagram of an ATDSUM value out put block according to the present invention.
Figure 9:
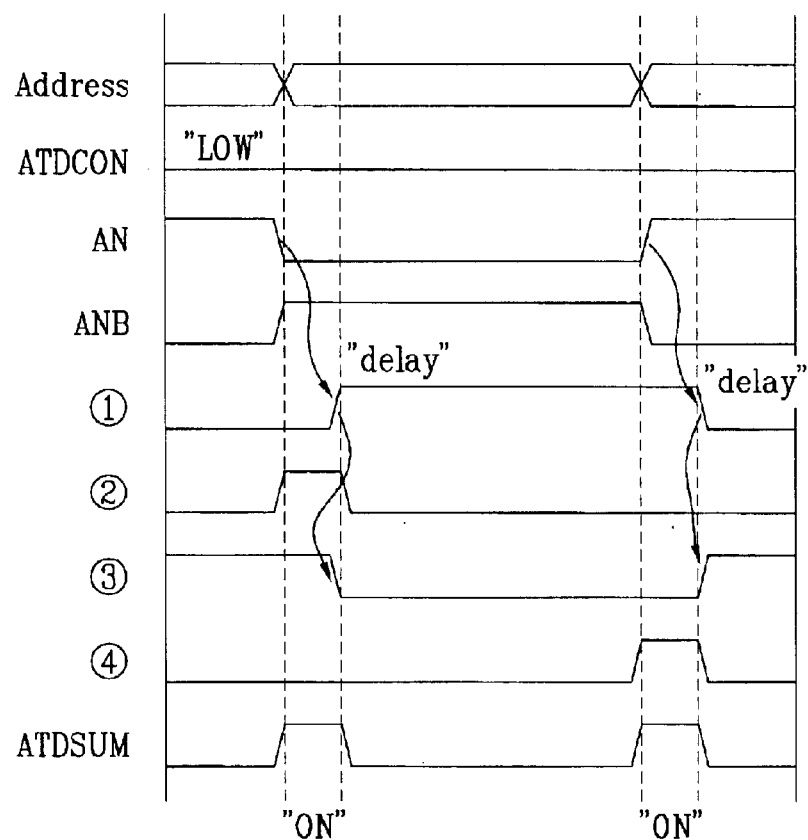
FIG. 9 is an operation timing diagram of the ATDSUM value output block.

FIG. 8 is a block diagram of an ATDSUM value output block according to the present invention. FIG. 9 is an operation timing diagram of an ATDSUM value output block.

The ATDSUM value output block includes an address delay block 81 including serially connected n inverters, the address delay block 81 for delaying the address signal ANB of the address buffer 42 for a predetermined time, a first inverter 82 for inverting an output signal of an (n−1)-th inverter of the address delay block 81, a second inverter 83 for inverting an output signal of the first inverter 82, a first NOR gate 84 for performing a logic operation using the output address signal AN of the address buffer 42, an output signal of the address delay block 81, and the cell operation pulse ATDCON of the cell operation pulse generating block 48 as inputs, a second NOR gate 85 for performing a logic operation using an output signal of the second inverter 83, the address signal ANB of the address buffer 42, and the cell operation pulse ATDCON of the cell operation pulse generating block 48 as inputs, and first and second output transistors 86 and 87, whose each one side elect rode is commonly connected to an output port for outputting an ATDSUM value, to whose gates output signals of first and second NOR gates 84 and 85 are applied, and to whose each other end a ground voltage is applied.

In the ATDSUM value output block 46, as illustrated in FIG. 9, when an address is transited in a state where an ATDCON is at a low state, to thus detect the ATD signal, the address AN signal and the address. ANB signal of the address buffer 42 are transited from high to low and from low to high, respectively.

In the node 1 of FIG. 8, transition from low to high occurs by being delayed for a predetermined time by the address delay block 81. Transition from high to low occurs during the next address transition.

In the node 3, transition from high to low occurs by being delayed for a predetermined time by the address delay block 81. Transition from low to high occurs during the next address transition.

The node 2 is at a high level only in a delay period during first address transition. The node 4 is at a high level only in a delay period during the next address transition.

Therefore, The ATDSUM in the, final output port is turned "on" while the levels of the nodes 2 and 4 are high.

The pulse width extension/control pulse generating block according to the present invention will now be described.

Figure 10:
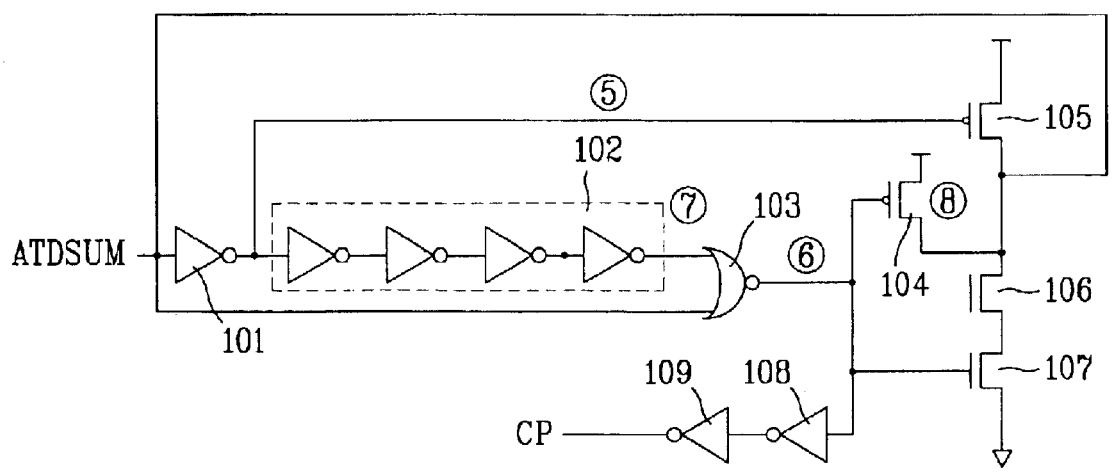
FIG. 10 is a block diagram of a pulse width extension/control pulse generation block according to the present invention.
Figure 11:
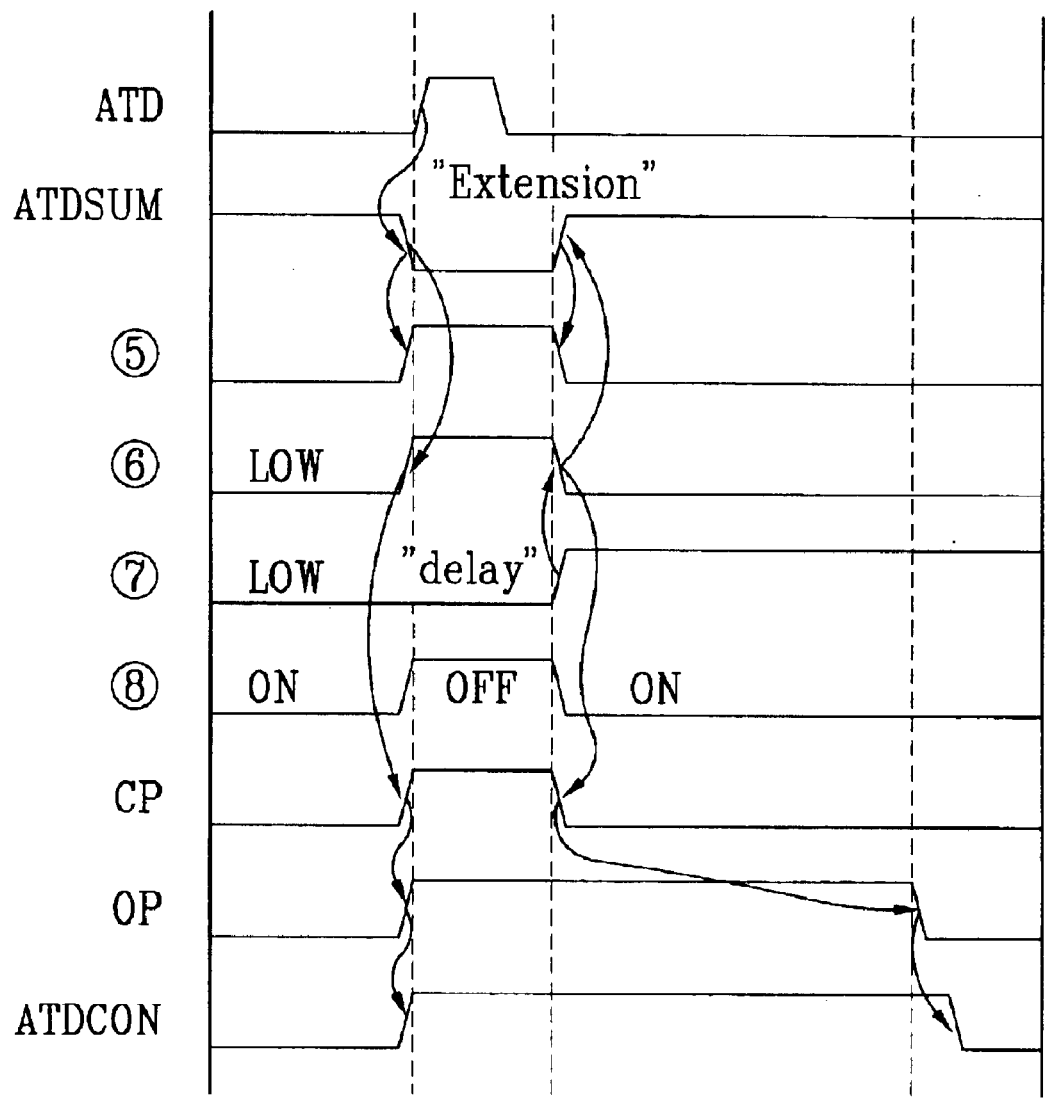
FIG. 11 is an operation timing diagram of the pulse width extension/control pulse generation block.

FIG. 10 is a block diagram of the pulse width extension/control pulse generating block according to the present invention. FIG. 11 is an operation timing diagram of the pulse width extension/control pulse generating block.

The pulse width extension/control pulse generating block 47 includes a first inverter 101 for inverting the ATDSUM pulse output from the ATDSUM value output block 46, an ATDSUM value delay block 102, to which a plurality of inverters are serially connected, the ATDSUM value delay block 102 for delaying the inverted ATDSUM for a uniform time, a NOR gate 103 for performing a NOR operation on the inverted ATDSUM delayed by the ATDSUM value delay block 102 and the input ATDSUM that is not delayed, a first PMOS transistor 104, to one side electrode a power supply voltage is applied, to the other side electrode the ATDSUM is applied, and to the gate an output signal of the NOR gate 103 is applied, a second PMOS transistor 105, a power supply voltage is applied to one side electrode, to the other side electrode the ATDSUM is applied, and to the gate the inverted ATDSUM is applied, a first NMOS transistor 106, to the gate the inverted ATDSUM is applied and whose one side electrode is connected to the other electrodes of the first and second PMOS transistors 104 and 105, a second NMOS transistor 107, which is serially connected to the first NMOS transistor 106, to the other side electrode, a ground voltage is applied, and whose gate is connected to the output port of the NOR gate 103, a second inverter 108 connected to the output port of the NOR gate 103, the second inverter 108 for inverting the output signal of the NOR gate, and a third inverter 109 for inverting an output signal of the second inverter 108 and outputting the CP.

The control pulse generating operation of the pulse width extension/control pulse generating block 47 is as illustrated in FIG. 11.

The ATDSUM extended at the time point of the transition of the ATD is inverted through the first inverter 101 in the node 5. In the node 7, the ATDSUM is delayed for a predetermined time in a low level by the ATDSUM value delay block 102 and is transited to a high level.

The node 6 is at a high level from a point of time where transition of the ATDSUM occurs to the point of time where transition delayed in the node 7 occurs.

The first PMOS transistor 104 of the node 8 is turned off only in a period where the pulse level in the node 6 is high.

The pulse of the node 6 is output to the CP through the second and third inverters 108 and 109. A control pulse is output to the cell operation pulse ATDCON by the cell operation pulse generating block 48 of FIG. 4.

The overall operation of the apparatus for driving the ferroelectric memory according to the present invention is as follows.

Figure 12:
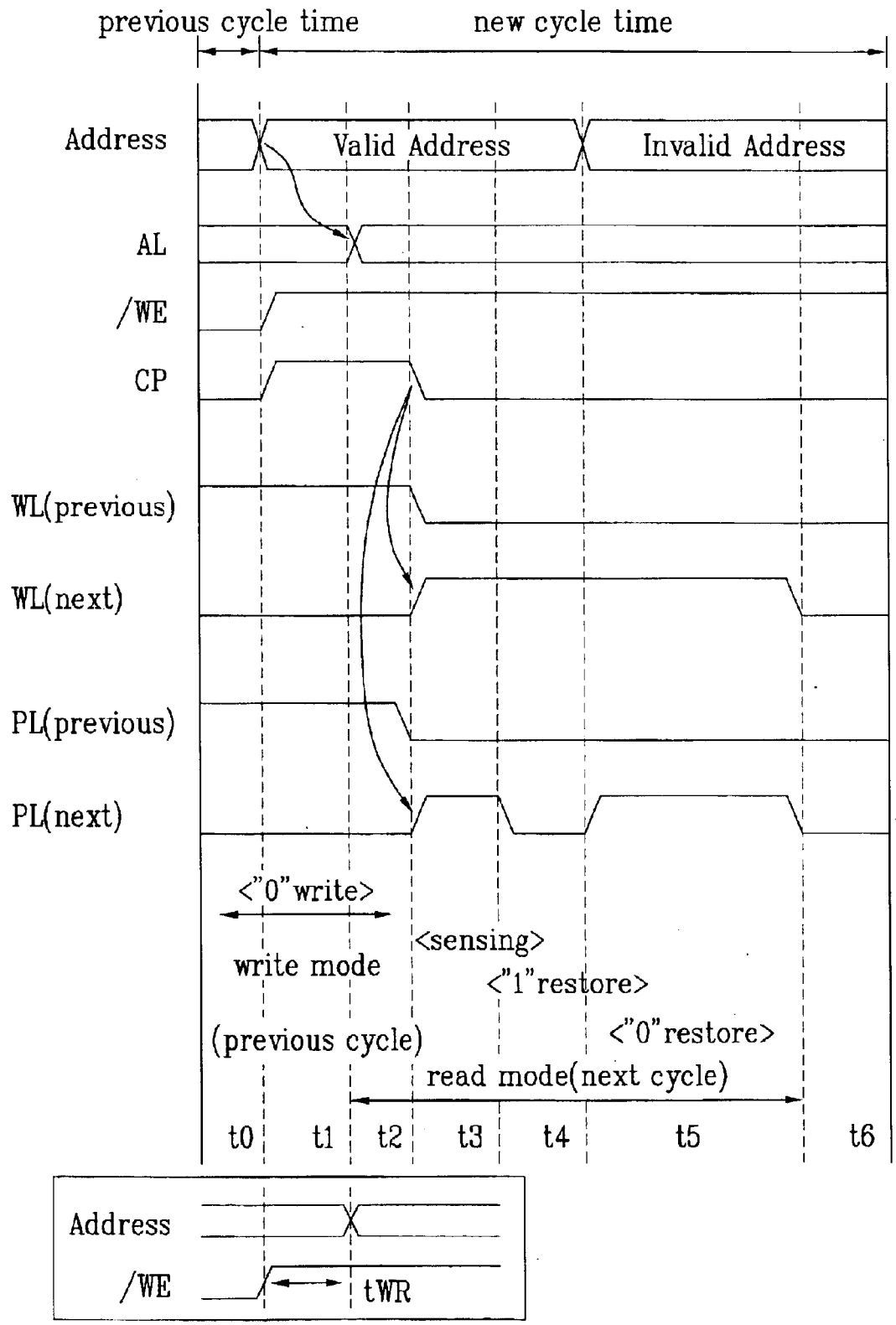
FIG. 12 is a detailed operation timing diagram of a waveform related to "0" write in a signal related to a control pulse CP according to the present invention.

FIG. 12 is a detailed operation timing diagram of a waveform related to "0" write in signal related to the CP according to the present invention.

The WL (next) and the PL (next) of the next address are activated using the end edge of the CP.

Also, the WL (previous) and the PL (previous) of the previous address are deactivated using the end edge of the CP.

Therefore, in a period where the CP is activated, a write recovery time tWR is guaranteed. That is, a point of time where a write enable (WE) signal is transited from a low level to a high level can be delayed to the end edge of the CP.

In the operation timing diagram of FIG. 10, t1, t2, t3 periods are write mode periods of a previous cycle, which are "0" write periods. t3, t4, and t5 period are read mode periods of a new cycle. The t3 period is a sensing period. The t4 period is a "1" resaving period. The t5 period is the "0" resaving period.

It is noted that the write recovery time tWR is guaranteed by the delay of the transition point of time of a WE pulse even though a new address input at the starting point of the t1 period.

Figure 13:
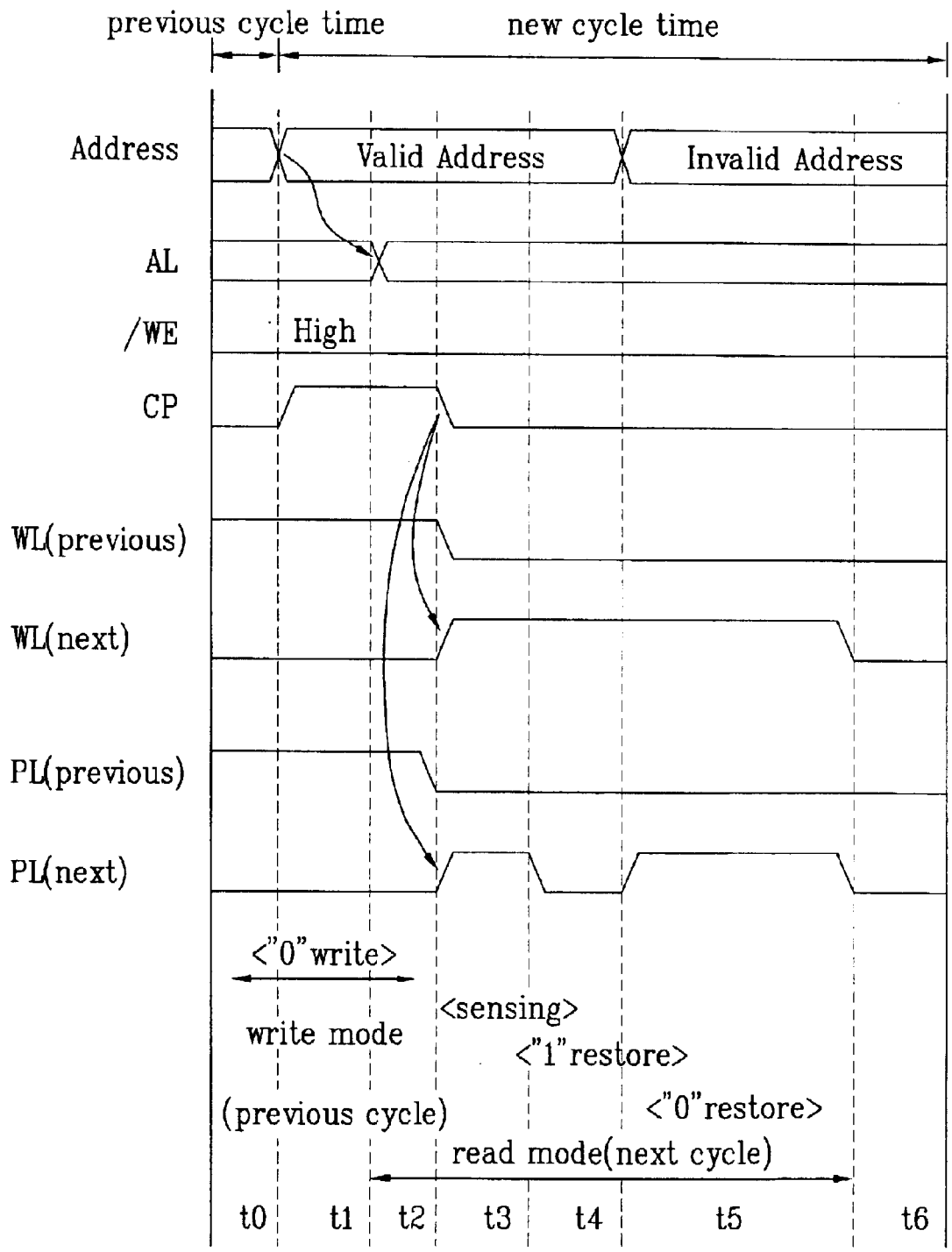
FIG. 13 is a detailed operation timing diagram of a waveform related to "0" resaving in a signal related to the control pulse CP according to the present invention.

FIG. 13 is a detailed operation timing diagram of a waveform related to "0" resaving in a signal related to the CP according to the present invention.

Because the address of a previous cycle is effective in a high period of the CP of a new cycle, the period can be used as the "0" resaving period in the read mode of the CP period.

Figure 14:
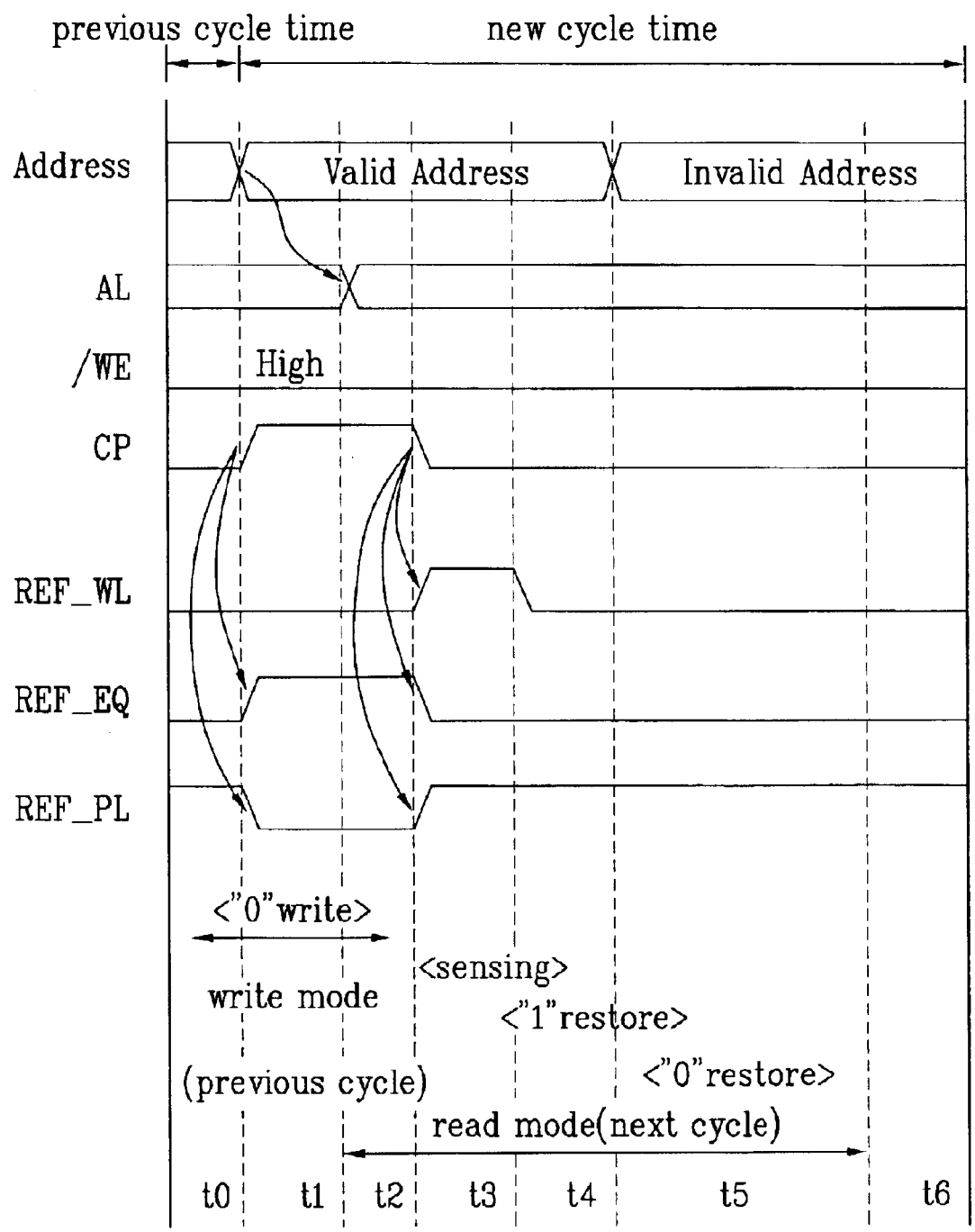
FIG. 14 is a detailed operation timing diagram related to the generation of a reference pulse in a signal related to the control pulse CP according to the present invention.

FIG. 14 is a detailed operation timing diagram related to the generation of a reference pulse in a signal related to the CP according to the present invention.

Reference charge is charged to a reference capacitor using REF_EQ and REF_PL during the CP period.

FIG. 14 illustrates a procedure of supplying the charged charge to a reference bit line during a t3 period.

An example of a reference pulse generating circuit for generating the reference pulse in FIG. 14 will now be described.

It is apparent that the reference generating circuit can have a structure different from the structure of FIG. 15, which will now be described.

Figure 15:
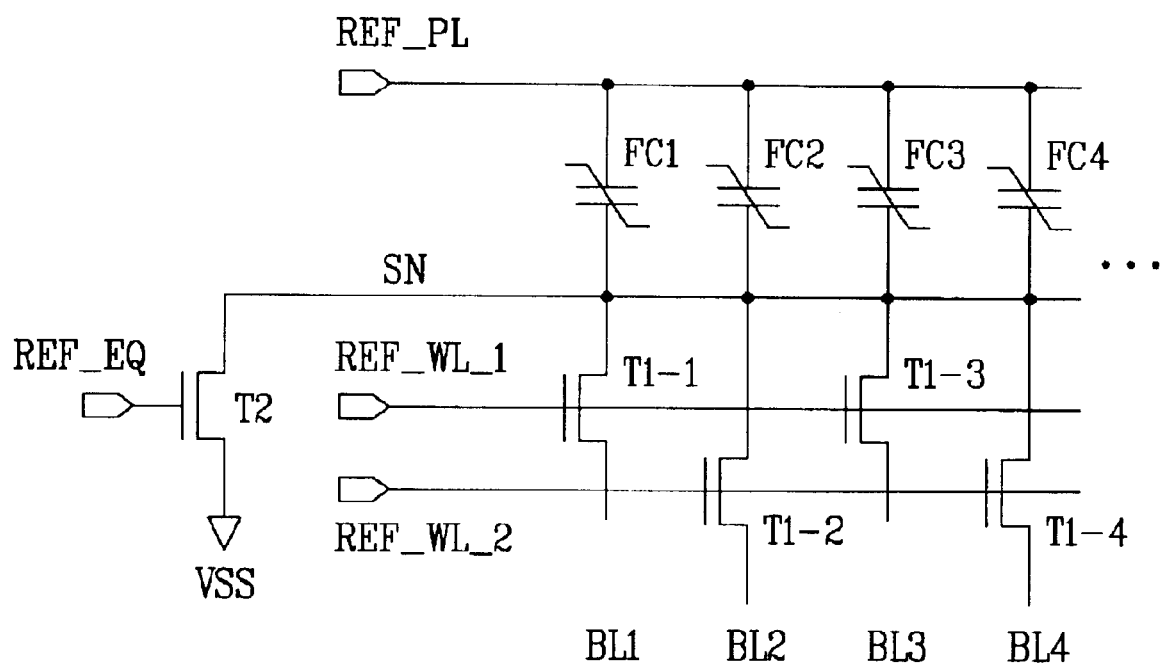
FIG. 15 is a circuit diagram illustrating an embodiment of a reference pulse generating circuit adopted by the present invention.

FIG. 15 is a circuit diagram illustrating an embodiment of a reference pulse generating circuit adopted by the present invention.

The reference pulse generating circuit includes a plurality of bit lines BL1, BL2, BL3, . . . , and BLn in a direction, first and second reference word lines REF_W/L_1 and REF_W/L_2 in a direction perpendicular to the direction of the bit lines BL1, BL2, BL3, . . . , and BLn, a reference plate line. REF_P/L in the same direction as that of the first and second reference word lines REF_W/L_1 and REF_W/L_2, a plurality of reference capacitors FC1, FC2, FC3, . . . , and FCn, whose first electrode is connected to the reference plate line REF_P/L, whose second electrode is connected to the storage node SN of the reference cell, and which are formed in parallel to each other, a level initializer formed of an NMOS transistor T2, to whose gate the reference cell equalization control signal REF_EQ is applied, whose one side electrode is connected to a ground terminal VSS, and whose the other side electrode is connected to the storage node SN, and a switching block formed of a plurality of NMOS transistors T1-1, T1-2, T1-3, . . . , and T1-n, to whose one side electrode is connected to the bit lines, whose the other side electrode is connected to the storage node SN of the reference capacitors and whose gate is alternately and commonly connected to the first reference world line REF_W/L_1 and the second reference word line REF_W/L_2.

The reference charge generating circuit in FIG. 15 exchanges REF_WL_1 for REF_WL_2 in a case of a folded bit line (Folded B/L) to be activated when a corresponding bit line is a reference.

The first preferred embodiment of the present invention as described above is for guraranteeing a cycle time of a corresponding address by using an ATD signal. Meanwhile, the second preferred embodiment of the present invention for sufficiently guraranteeing a cycle time of a corresponding address by using both of the ATD and WTD will be described as follows.

Figure 16:
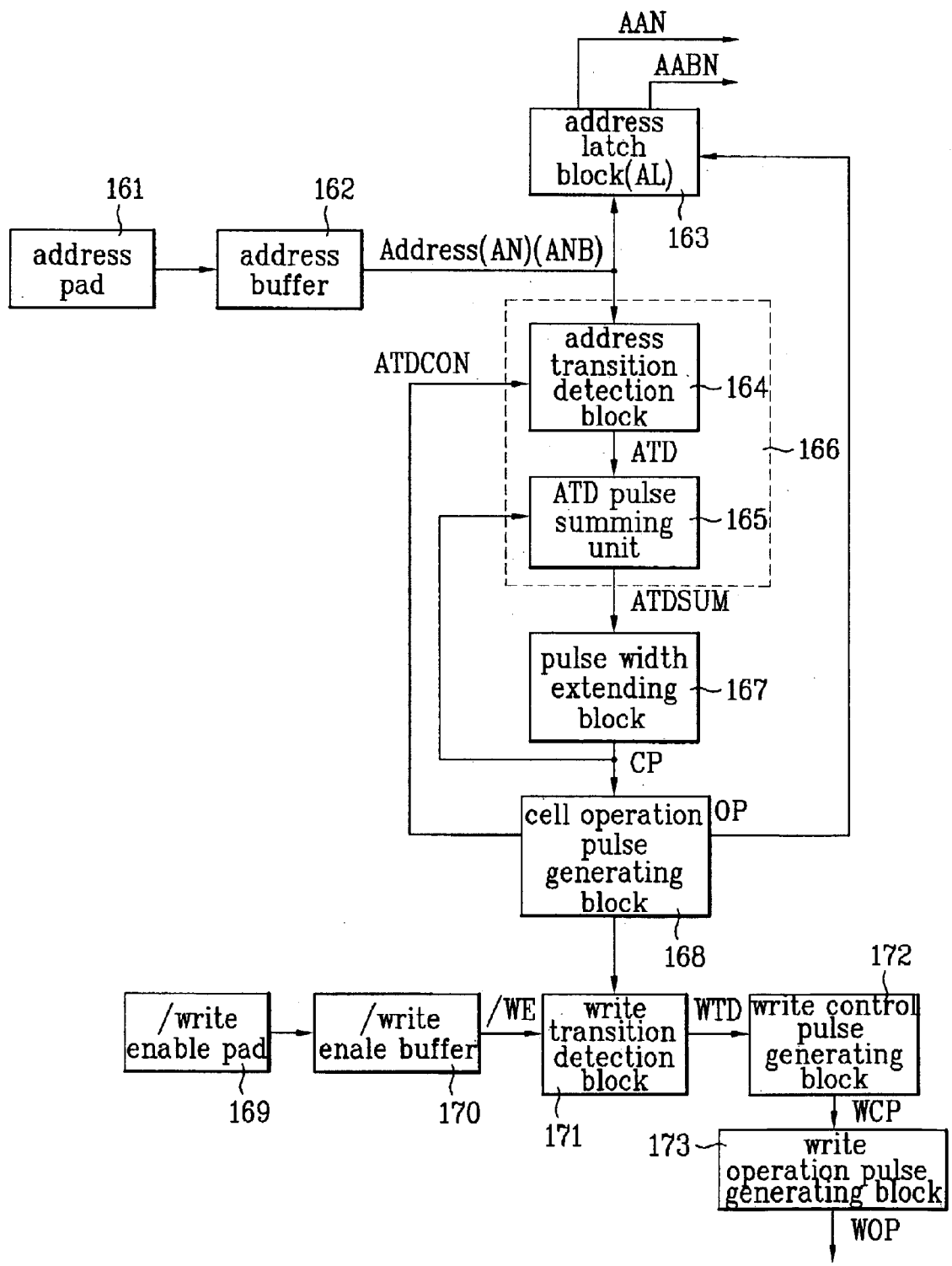
FIG. 16 is a block diagram illustrating a structure of an apparatus for driving a ferroelectric memory according to a second embodiment of the present invention.
Figure 17:
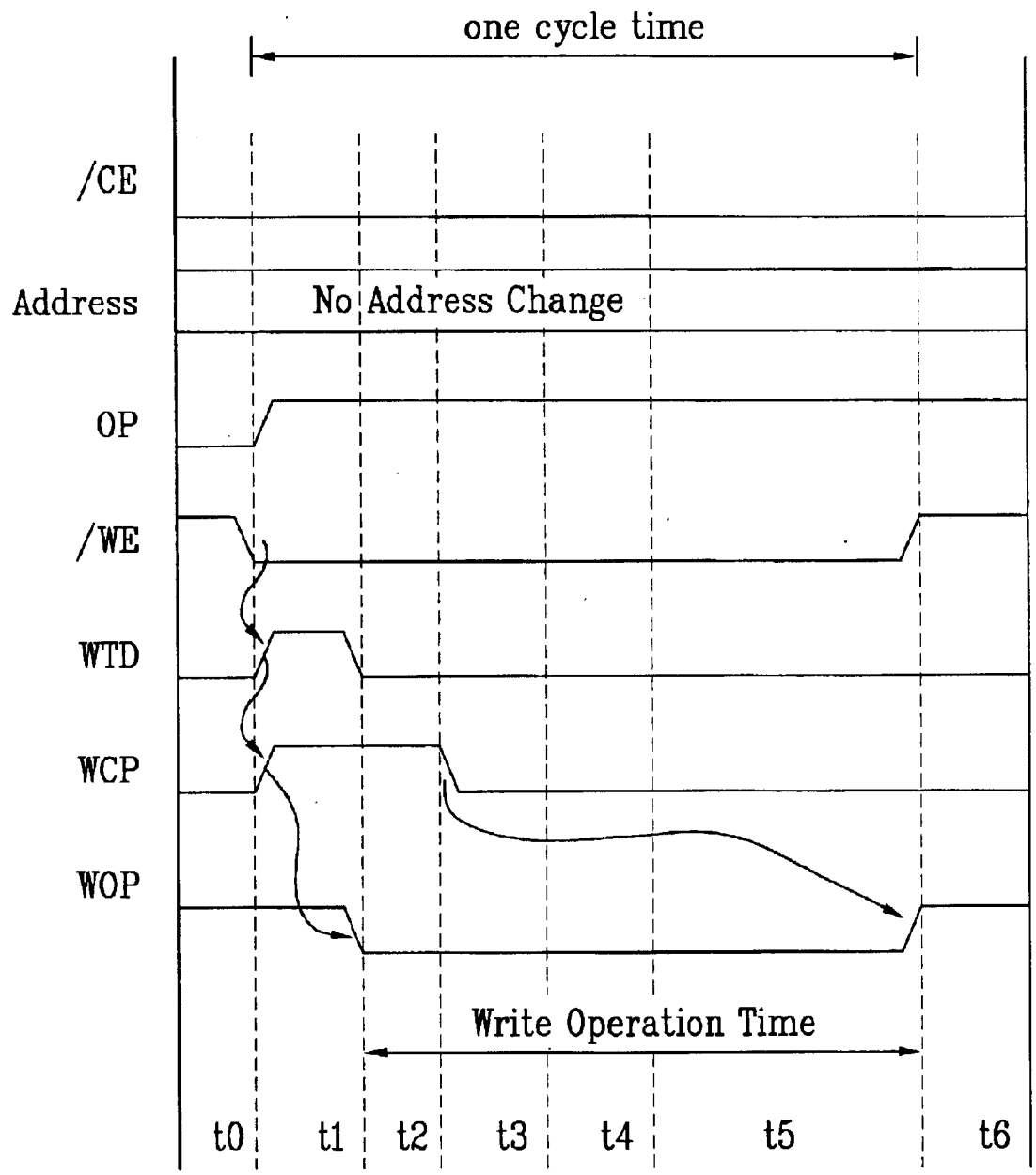
FIG. 17 is an operation timing diagram of the apparatus for driving a ferroelectric memory of FIG. 16.

FIG. 16 is a detailed block diagram illustrating a structure of an apparatus for driving ferroelectric memory according to a second embodiment of the present invention, and FIG. 17 is an operation timing diagram of the apparatus for driving a ferroelectric memory of FIG. 16.

The second preferred embodiment of the present invention illustrates a circuit structure in a case that a write cycle operation is performed by using a /WE signal without change of the address signal, and represents blocks for a cell operation pulse in a case of performing a write operation very after a read operation at a same address.

The structure, firstly, includes an address pad 61 which an address signal is applied to, an address buffer 162 for outputting the address signal input t ed to the address pad 161 by buffering, an address latch block (AL) 163, in which the buffered address signal address AN and ANB, for latch-outputting the address signal in order to remove an address skew, an ATDSUM value outputting block 166 having an address transition detection block 164 for generating an address transition detection pulse by detecting change of the address signal and an ATD summing unit 165 for outputting the ATDs generated by a plurality of address by summing the same, and a pulse width extension/control pulse generating block 167 for extending a pulse width of an output signal ATDSUM of the ATDSUM value outputting block 166 in order to restrict loss of data generated due to the reason that a normal cycle time is not guaranteed by an ATDSUM having abnormal small pulse width and for outputting a chip control pulse CP by using the extended pulse signal.

Here, the control pulse generating block 167 generates the control pulse CP by receiving a starting edge of the pulse signal with the extended pulse width and feedbacks the control pulse CP to the ATD summing unit 165 of the ATDSUM value outputting block 166 again, so that the pulse signal with the extended pulse width is stabilized at a control pulse CP period.

The control pulse CP of the control pulse generating block 167 is inputted into the cell operation pulse OP generating. block 168, and the cell operation pulse generating block 168 generates the cell operation pulse (OP) having a pulse width need to operate a normal read/write chip operation.

Here, the cell operation pulse OP of the cell operation pulse generating block 168 is feedback to the address transition detection block 164 to be used as a control signal ATDCON when the address transition is detected.

This is for intercepting input of the ATD from a starting edge to an edge of an ending portion of the cell operation pulse OP.

The cell operation pulse OP is feedback to the address latch block 163 in order that the address signal is latched at the starting edge of the cell operation pulse OP.

The cell operation pulse OP generating block is constructed as described above, blocks for performing a write cycle operation without change of address includes a /write enable pad 169 into which a /write enable signal /WE is applied, a /write enable buffer 170 for outputting the /write enable signal /WE by buffering the same, a write transition detection block 171 for outputting a write transition detection signal WTD by receiving the /write enable signal and the cell operation pulse OP as input only when the cell operation pulse OP is high, a rite control pulse generating block 172 for outputting a write control pulse WCP in order to performing a normal write operation by the write transition detection signal WTD, and a write operation pulse generating block 173 for outputting a write operation pulse (WOP) to intercept other operation and perform only a write operation in a low level region in accordance with the write control pulse WCP outputted from the write control pulse generating block 172.

The circuit in FIG. 16, as described above, illustrates a case that the write operation is performed very after the read operation at a same address, and is for determining the generation of the WTD according to a status of the cell operation pulse OP when the write transition detection WTD pulse is generated by the /WE signal.

If the cell operation pulse OP is low, it is determined that the chip is normally operated so that the WTD pulse is not generated but generated only at a period where the cell operation pulse OP is high.

The WTD pulse generates the write control pulse WCP in order for the write operation to normally operate.

As shown in FIG. 17, the address does not change during one cycle time, the WTD signal is detected by using only the /WE signal for a period which the cell operation pulse OP, and normal write time, that is, t2, t3, t4, and t5 periods are guaranteed by using the detected WTD pulse.

Detail construct ion of each block for generating the WOP by using the /WE in the ferroelectric memory according to the second preferred embodiment will be described as follows.

Figure 18:
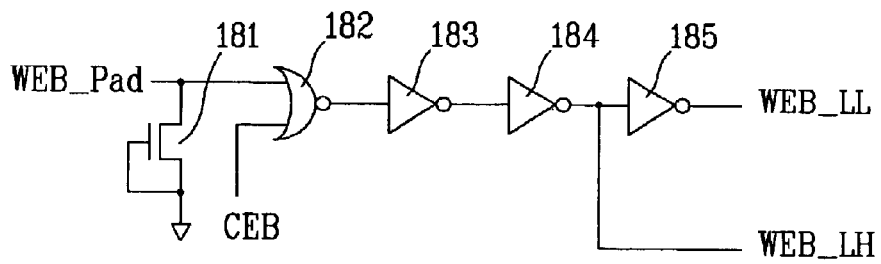
FIG. 18 is a detailed block diagram of a write enable buffer.
Figure 19:
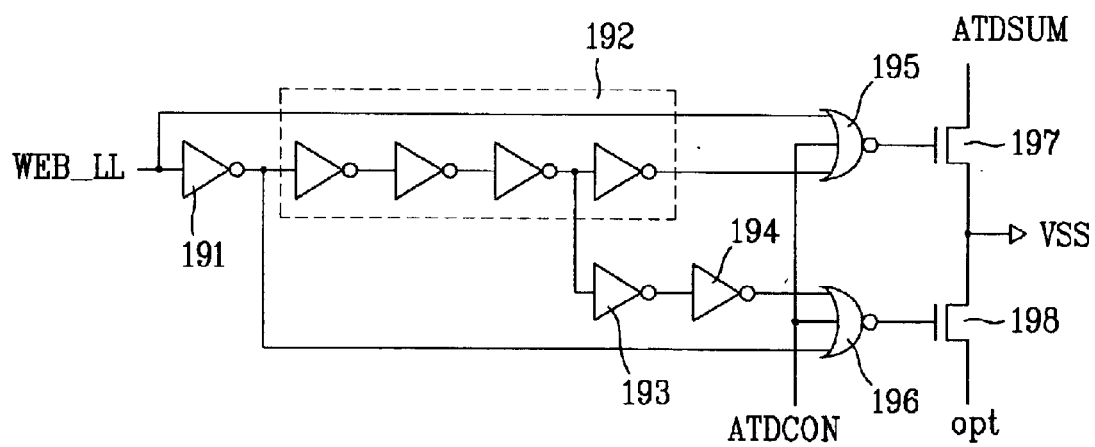
FIG. 19 is a detailed block diagram of a write transition detection block.

FIG. 18 is a detailed block diagram of a write enable buffer, and FIG. 19 is a detailed block diagram of a write transition detection block.

The write enable buffer, as shown in FIG. 18, includes a logic operation means 182 for performing a NOR operation of a write enable pad signal WEB_Pad applied to a first input terminal with an ESD transistor 181 in order for buffering a /write enable signal and a /chip enable signal CEB applied to a second input terminal, a first inverter 183 for inverting an output signal from the logic operation means 182, a second inverter 184 for re-inverting an output signal from the first inverter 183 so as to output a first /write enable signal WEB_LH, and a third inverter 185 for inverting an output signal from the second inverter 184 so as to output a second /write enable signal WEB_LL.

The write transition detecting block, as shown in FIG. 19, includes a first inverter 191 for inverting a second /write enable signal WEB_LL of a write enable buffer, a /write enable signal delay block 192 for delaying the inverted /write enable signal WEB_LL for a predetermined time and having n inverters being connected in serial, a second inverter 193 for inverting an output signal from an n−1st inverter of the /write enable signal delay block 192, a third inverter 194 for inverting an output signal from the second inverter 192, a first NOR gate 195 for receiving and logically operating the second /write enable signal WEB_LL, an output signal from the /write enable signal delay block, and a cell operation pulse ARDCON, a second NOR gate 196 for receiving and logically operating an output signal from the third inverter 194, the inverted second /write enable signal WEB_LL, and the cell operation pulse ATDCON, and a first output transistor 197 whose one end becomes an output terminal of the ATDSUM value, whose a gate is applied with an output signal from the first NOR gate 195, and whose other electrode is applied with a ground voltage, and a second transistor 198, connected to the first output transistor 197 in serial, whose a gate is applied with an output signal from the second NOR gate 196, whose one electrode is connected to a ground terminal in common with the other electrode of the first output transistor 197, and whose other electrode becomes an optional signal op input terminal.

When a chip enable signal CEB1_con is used, a chip enable signal transition detection block is used so that a cycle time of a corresponding address can be sufficiently guaranteed by intercepting different address which is entered into, thereby the normal read/write operation is completed at the corresponding address.

Figure 20:
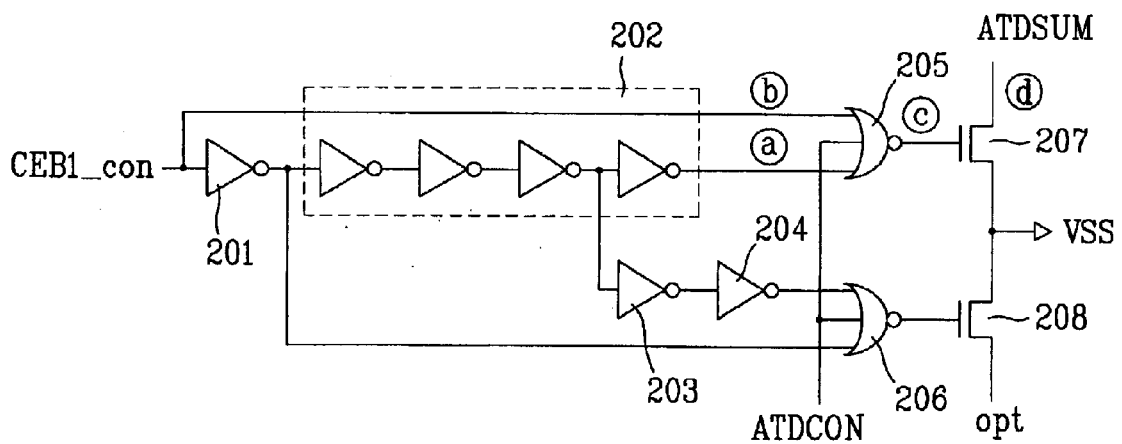
FIG. 20 is a detailed block diagram of a chip enable signal transition detection block.
Figure 21:
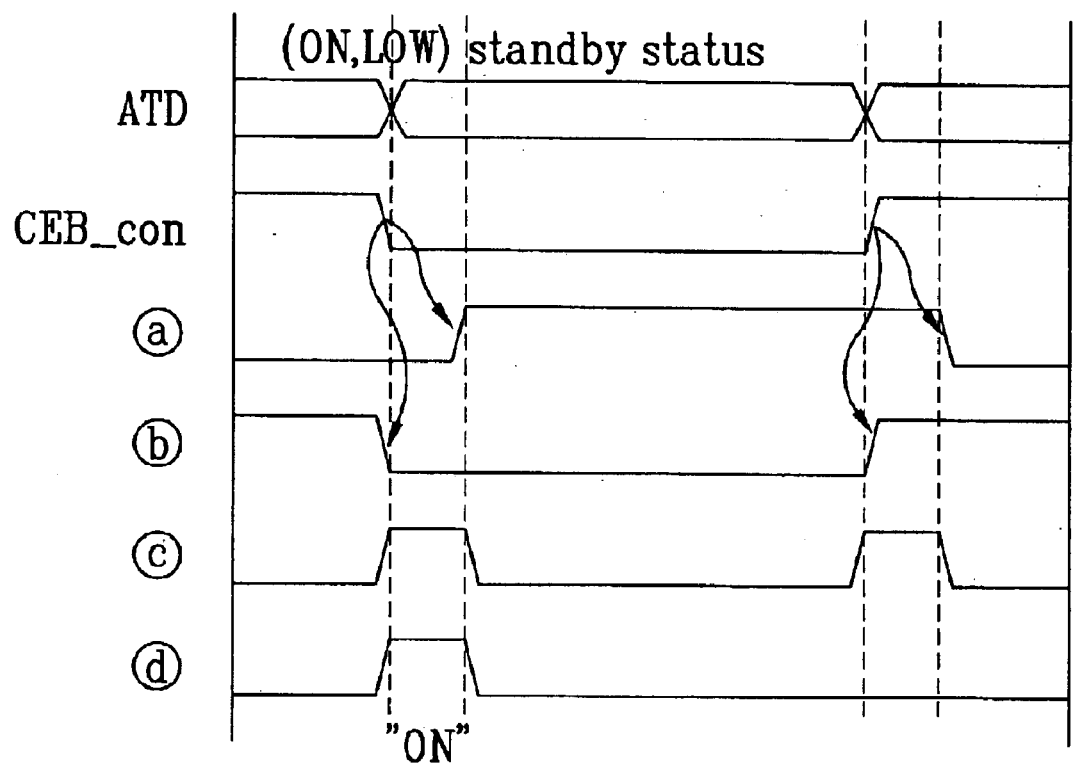
FIG. 21 is an operation timing diagram of a CTD (or a WTD).

FIG. 20 is a detailed block diagram of a chip enable signal transition detection block, and FIG. 21 is an operation timing diagram of a CTD (or a WTD).

The chip enable signal transition detection block includes a first inverter 201 for inverting a chip enable signal CEB1_con, a chip enable signal delay block 202 for delaying the inverted chip enable signal CEB1_con for a predetermined time and having n inverters being connected in serial, a second inverter 203 for inverting an output signal from an n−1st inverter of the chip enable signal delay block 202, a third inverter 204 for inverting an output signal from the second inverter 203, a first NOR gate 205 for receiving and logically operating the chip enable signal CEB1_con, an output signal from the chip enable signal delay block 202, and the cell operation pulse ARDCON of the cell operation pulse generating block 168, a second NOR gate 206 for receiving and logically operating an output signal from the third inverter 204, the inverted second chip enable signal CEB1_con, and the cell operation pulse ATDCON, a first output transistor 207 whose one end becomes an output terminal of the ATDSUM value, whose a gate is applied with an output signal from the first NOR gate 205, and whose other electrode is applied with a ground voltage, and a second transistor 208 connected to the first output transistor 207 in serial and whose a gate is applied with an output signal from the second NOR gate 206, whose one electrode is connected to a ground terminal in common with the other electrode of the first output transistor 207, and whose other electrode becomes an optional signal opt input terminal.

The output operation of the ATDSUM value from the chip enable signal transition detection block as described above will be followed.

The operations of the chip enable signal transition detection block and the write transition detection block are basically same to each other except for a difference of using the chip enable signal or the write enable signal as a source signal for outputting the ATDSUM value.

When the chip enable signal is used, the ATD is in the low level, under a standby status. At this status, when the transition of the chip enable signal CEB_con is occurred, the transition at a node · is occurred after being delayed at a predetermined time by the chip enable signal delay block 202.

At a node ·, the transition is occurred like the transition of the chip enable signal CEB_con to be inputted.

Therefore, at a node ·, the chip enable signal CEB_con is transited to the high level at a time when the transition at the node · is occurred. Under the high level is kept, the transition from the time when the transition is occurred at the node · to the low level again.

The transition at the node · is identically occurred at a time when next transition of the chip enable signal CEB_con is occurred.

Moreover, the first output transistor 207 at a node · is turned on at a time when the first transition of the chip enable signal CEB_con is occurred so that outputs the ATDSUM value.

As described above, the apparatus and method for driving a ferroelectric memory have the following advantages.

In a memory device including a ferroelectric memory, if a different address enters, the different address can be intercepted to complete a normal read/write operation in a corresponding address so that a cycle time of the corresponding address can be guaranteed.

The apparatus and method according to the present invention have advantages of gurarranteeing the read/write cycle time of the corresponding address, stabilizing the chip operation by removing introduced address short pulse noise, and restricting data loss.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. An apparatus for driving a ferroelectric memory in a driving circuit that generates an operation pulse for controlling operation of a ferroelectric chip, the apparatus comprising:

an address latch block for latching a buffered address signal by a feedback cell operation pulse;

an address transition detection summation (ATDSUM) value outputting block for generating an address transition detection pulse (ATD) signal by detecting change of an address signal, and outputting summation of address transition pulses (ATDSUM) generated by a plurality of addresses;

a pulse width extension/control pulse generating block for extending a pulse width of the summation of the address transition pulses (ATDSUM), and outputting a chip control pulse by using an extended signal; and a cell operation pulse generating block for generating a cell operating pulse with a pulse width required on a read/write chip operation by using the chip control pulse;

wherein in an active region of the cell operation pulse corresponding to the address, an ATD signal of another address is not generated.

2. The apparatus as claimed in claim 1, wherein the cell operation pulse generating block feedbacks the cell operation pulse to an address shift detecting block so that the ATD signal is interrupted in a region from a starting edge to ending edge of the cell operation pulse.

3. The apparatus as claimed in claim 1, wherein the buffered signal is latched from a starting edge of the cell operation pulse by which the cell operation pulse is feedback to the address latch block.

4. The apparatus as claimed in claim 1, further comprising an address buffer, which comprises:

a logic operation means for performing a NOR operation of an address pad signal (AN_Pad) being applied to a first input terminal with an ESD transistor in order for buffering the address signal and a /chip enable control signal (CEBCON) being applied to a second input terminal;

a first inverter for inverting an output signal from the logic operation means;

a second inverter for re-inverting an output signal from the first inverter so as to output an /address signal (ANB) for resetting; and a third inverter for inverting an output signal from an second output signal so as to output an address signal (AN).

5. The apparatus as claimed in claim 1, wherein the address latch block comprises:

a first transmission gate for selectively switching-outputting an output signal (AN) of an address buffer according to the cell operation pulse (OP) and a /cell operation pulse (OPB);

a latch means for latching an output signal from the first transmission gate, the latch means including a first and second inverters connected to an output terminal of the first transmission gate in serial;

a second transmission gate for selectively switching an output signal being feedback by the latch means according to the cell operation pulse (OP) and the /cell operation pulse (OPB) and outputting the switched output signal to the output terminal of the first transmission gate;

a third inverter for inverting an output signal from the first inverter and outputting the inverted output signal (AAN) to a pre-decoder;

a fourth inverter for inverting the output signal from the first inverter; and a fifth inverter for inverting an output signal from the fourth inverter and outputting the inverted output signal (AABN) to the pre-decoder.

6. The apparatus as claimed in claim 1, wherein the address transition detection summation (ATDSUM) value outputting block comprises:

an address delay block for delaying an /address signal (ANB) for a determined time, the address delay block having n inverters connected in serial;

a first inverter for inverting an output from a (n−1)-th inverter of the address delay block;

a second inverter for inverting an output from the first inverter;

a first NOR gate for receiving and logically operating an output address signal (AN) from the address buffer, an output signal from the address delay block, and a cell operation pulse (ARDCON);

a second NOR gate for receiving and logically operating an output signal from the second inverter, an /address signal (ANB), and the cell operation pulse (ATDCON); and a first and second transistors whose one ends are connected in common to an output terminal which outputs the ATDSUM value, whose gates are applied with output signals from the first and second NOR gates, and other electrodes thereof are applied with a ground voltage.

7. The apparatus as claimed in claim 1, wherein the pulse width extension/control pulse generating block comprises:

a first inverter for inverting an ATDSUM the address transition detection summation (ATDSUM) value outputting block;

an ATDSUM value delay block, connected with a plurality of inverters in serial, for delaying the inverted ATDSUM at a predetermined time;

a NOR gate for performing NOR operation of the inverted ATDSUM delayed by the ATDSUM value delay block and a non-delayed input ATDSUM;

a first PMOS transistor whose an electrode is applied with a power voltage, other electrode is applied with the ATDSUM, and a gate is applied with an output signal from the NOR gate;

a second PMOS transistor whose an electrode is applied with a power voltage, other electrode is applied with the ATDSUM, and a gate is applied with the inverted ATDSUM;

a first NMOS transistor whose gate is applied with the inverted ATDSUM, other electrode is connected to the other electrodes of the first and second PMOS transistors;

a second NMOS transistor whose an electrode is connected to the first NMOS transistor in serial, other electrode is applied with the ground voltage, and a gate is connected to an output terminal of the NOR gate;

a second inverter connected to the output terminal of the NOR gate for inverting the output signal from the NOR gate; and a third inverter inverting an output signal from the second inverter and for outputting a control pulse (CP).

8. An apparatus for driving a ferroelectric memory in a driving circuit that generates an operation pulse for controlling operation of a ferroelectric chip, the apparatus comprising:

an address transition detection summation (ATDSUM) value outputting block for generating an address transition detection pulse (ATD) signal by detecting change of an address signal, and for outputting summation of address transition pulses (ATDSUM) generated by a plurality of addresses;

a pulse width extension/control pulse generating block for extending a pulse width of the summation of the address transition pulses (ATDSUM) and outputting a ship control pulse by using an extended signal;

a cell operation pulse generating block for generating a cell operating pulse with a pulse width required on a read/write chip operation by using the chip control pulse;

a write transition detecting block for receiving a buffered /write enable signal and a cell operation pulse and for outputting a write transition detection signal only in an active region of the cell operation pulse;

a write control pulse generating block for outputting a write control pulse (WCP) according to the write transition detection signal; and a write operation pulse generating block for outputting a write operation pulse (WOP) to intercept other operation and perform only a write operation in a low level region in accordance with the write control pulse WCP.

9. The apparatus as claimed in claim 8, wherein the generation of the write operation pulse according to the write transition detection pulse is occurred when a continuous write operation is performed without a corresponding address.

10. The apparatus as claimed in claim 8, wherein if the cell operation pulse is low, the chip is determined to be normally operated in accordance with the address transition detection pulse so that the write transition detection pulse (WTD) does not generate, and the write transition detecting pulse is generated only in a region where the cell operation pulse (OP) is high.

11. The apparatus as claimed in claim 8, further comprising a write enable buffer, which comprises:

a logic operation means for performing a NOR operation of a write enable pad signal (WEB_Pad) applied to a first input terminal with an ESD transistor in order for buffering a /write enable signal and a /chip enable signal (CEB) applied to a second input terminal;

a first inverter for inverting an output signal from the logic operation means;

a second inverter for re-inverting an output signal from the first inverter so as to output a first /write enable, signal (WEB_LH); and a third inverter for inverting an output signal from the second inverter so as to output a second /write enable signal (WEB_LL).

12. The apparatus as claimed in claim 8, wherein the write transition detecting block comprises:

a first inverter for inverting a second /write enable signal (WEB_LL) of a write enable buffer;

a /write enable signal delay block for delaying the inverted /write enable signal (WEB_LL) for a predetermined time, the /write enable signal delay block having n inverters being connected in serial;

a second inverter for inverting an output signal from an n–1st inverter of the /write enable signal delay block;

a third inverter for inverting an output signal from the second inverter;

a first NOR gate for receiving and logically operating the second /write enable signal (WEB_LL), an output signal from the /write enable signal delay block, and a cell operation pulse (ARDCON);

a second NOR gate for receiving and logically operating an output signal from the third inverter, the inverted second /write enable signal (WEB_LL), and the cell operation pulse (ATDCON); and a first output transistor whose one end becomes an output terminal of the ATDSUM value, whose a gate is applied with an output signal from the first NOR gate, and whose other electrode is applied with a ground voltage; and a second transistor, connected to the first output transistor in serial, whose a gate is applied with an output signal from the second NOR gate, whose one electrode is connected to a ground terminal in common with the other electrode of the first output transistor, and whose other electrode becomes an optional signal (opt) input terminal.

13. A method for driving a ferroelectric memory in a case that one cycle time is divided into intervals of t0, t1, t2, t3, t4, and t5 in order to generate an operation pulse for controlling an operation of a ferroelectric chip, the method comprising the steps of:

a) generating an address transition detecting pulse (ATD) signal at a starting portion of the t1 period when an address transition is occurred at an end portion of the t0 period;

b) summing the address transition detection pulse (ATD) pulse and outputting the summed address transition detection pulse (ATDSUM); and c) extending a pulse width of the summed address transition detection pulse (ATDSUM) so as for an end edge time thereof to extend to the t3 period and producing a control pulse (CP) by using the same;

wherein a cell operation pulse (OP) from the t2 period to the t5 period according to the control pulse (CP) is produced so that a normal read/write operations is performed from the t2 period to t5 period, and generation of the address transition detection pulse (ATD) signal is intercepted even if a new address is entered into an active period of the cell operation pulse (OP).

14. The method as claimed in claim 13, wherein the step b) comprises the sub-steps of:

i) transiting inputted address signal by delaying at a predetermined time when the address transition detection pulse (ATD) signal is detected by which an address is transited under a control signal (ATDCON) as the cell operation pulse being feedback and the control pulse (ATDCON) is low;

ii) outputting the summed address transition detection pulse (ATDSUM) to have a high level only during a delay period of the address signal and transiting the summed address transition detection pulse (ATDSUM) into low level at a time when a corresponding delay period is finished and maintaining the transited summed address transition detection pulse (ATDSUM); and iii) transiting the address signal by delaying for a predetermined time when a next address is transited in a low level maintain period of the summed address transition detection pulse (ATDSUM), and outputting the summed address transition detection pulse (ATDSUM) to have a high level only during the delay period.

15. The method as claimed in claim 13, wherein the step c) comprises:

1) inverting and delaying the summed address transition detection pulse (ATDSUM) after extending the pulse width thereof from a transition period of the address transition detection pulse (ATD);

2) transiting the summed address transition detection pulse (ATDSUM) to a high level at a finishing time of a delay period under the summed address transition detection pulse (ATDSUM) is maintained at a low level; and 3) outputting the control pulse to high level during a period from a transition time of the address transition detection pulse (ATD) to a transition time of the summed address transition detection pulse (ATDSUM) to the high level.

16. The method as claimed in claim 13, wherein when a write operation of "0" (zero) is performed by using the control pulse, a word line (WL) of a corresponding address and a plate (PL) operation signal are inactivated by using an end edge portion of the control pulse and a word line (WL) of new address and new plate (PL) operation signal are activated, so that a time when a /write enable signal (WE) is transited from a low level to a high level is delayed to an end edge portion of the control pulse, thereby a write recovery time (rWR) is guaranteed in the activation period of the control pulse.

17. The method as claimed in claim 16, wherein by using that an address of a previous cycle is available regardless of input of next address in the high period of the control pulse, a corresponding period on a read mode of the activation period of the control pulse is used as a restoring period of the logic "0" (zero).

18. A method for driving a ferroelectric memory in a case that one cycle time is divided into intervals of t0, t1, t2, t3, t4, and t5 in order to generate an operation pulse for controlling an operation of a ferroelectric chip, when a /WE signal is transited to a low level in a period where a cell operation pulse (OP), which is outputted by using an address transition detecting pulse (ATD) signal at an ending portion of the t0 period under without change of address, is in a high level, the method comprising the steps of:

a) transiting a write transition detection pulse to a high level at the t1 period and maintaining the transited write transition detection pulse for the t1 period;

b) maintaining the write control pulse (WCP) at the high level until an ending time of the t2 period by transiting the write control pulse (WCP) to the high level at a starting time of the t1 period by using the write transition detection pulse; and c) generating a write operation pulse (WOP) having a low level from an ending time of the t1 period that the write transition detection pulse is transited to the low level to an ending time of the t5 period that the /WE signal is transited to the high level again.

19. The method as claimed in claim 18, wherein a corresponding cycle time is a period that the write operation is very performed after a read operation without change of address.

* * * * *